(12) United States Patent
Giammattei et al.

(10) Patent No.: US 9,976,762 B2
(45) Date of Patent: May 22, 2018

(54) SYNTHETIC JET DRIVEN COOLING DEVICE WITH INCREASED VOLUMETRIC FLOW

(71) Applicant: General Electric Company, Schenectady, NY (US)

(72) Inventors: Mark Howard Giammattei, Selkirk, NY (US); Stanton Earl Weaver, Northville, NY (US); Pramod Chamarthy, Boston, MA (US)

(73) Assignee: General Electric Company, Schenectady, NY (US)

( * ) Notice: Subject to any disclaimer, the term of this patent is extended or adjusted under 35 U.S.C. 154(b) by 825 days.

(21) Appl. No.: 13/871,353

(22) Filed: Apr. 26, 2013

(65) Prior Publication Data
US 2014/0273796 A1 Sep. 18, 2014

Related U.S. Application Data

(60) Provisional application No. 61/783,065, filed on Mar. 14, 2013.

(51) Int. Cl.
*F24F 7/007* (2006.01)
*F04B 43/04* (2006.01)
(Continued)

(52) U.S. Cl.
CPC .............. *F24F 7/007* (2013.01); *F04B 23/10* (2013.01); *F04B 43/046* (2013.01); *F04F 5/16* (2013.01);
(Continued)

(58) Field of Classification Search
CPC .... F28C 3/00; F24F 7/007; B60H 1/34; F04B 23/10
(Continued)

(56) References Cited

U.S. PATENT DOCUMENTS

| 4,125,361 A | 11/1978 | Bourn |
| 5,347,809 A * | 9/1994 | Moeckel et al. ............... 60/274 |

(Continued)

FOREIGN PATENT DOCUMENTS

| CN | 1051414 A | 5/1991 |
| CN | 1855458 A | 11/2006 |

(Continued)

OTHER PUBLICATIONS

Lagorce et al., "Batch-Fabricated Microjet Coolers for Electronic Components", Proceeding of the International Symposium on Microelectronics, vol. No. 3252, pp. 494-449, Jan. 1, 1997.

(Continued)

*Primary Examiner* — Steven B McAllister
*Assistant Examiner* — Samantha Miller
(74) *Attorney, Agent, or Firm* — Ziolkowski Patent Solutions Group, SC; Jean K. Testa

(57) ABSTRACT

A synthetic jet driven cooling device includes at least one synthetic jet actuator to generate and project a series of fluid vortices. A manifold coupled to the synthetic jet actuator(s) receives the fluid vortices and generates a primary air stream. An air amplifier connected to the manifold by a connecting pipe receives the primary air stream. The air amplifier includes an air intake oriented perpendicular to the connecting pipe and an air outlet positioned opposite the air intake, with a venturi section positioned between the air intake and air outlet that has a diameter smaller than the air intake diameter. A low pressure region in a center of the venturi section entrains a surrounding air in through the air intake to generate a secondary air stream that combines with the primary air stream to generate a combined air flow that flows through the venturi and exits the air outlet.

17 Claims, 6 Drawing Sheets

(51) Int. Cl.
*F04F 5/16* (2006.01)
*H01L 23/467* (2006.01)
*F04B 23/10* (2006.01)

(52) U.S. Cl.
CPC .... *H01L 23/467* (2013.01); *H01L 2924/0002* (2013.01); *Y10T 29/49359* (2015.01)

(58) Field of Classification Search
USPC .................. 454/251; 239/102.2; 165/80.3
See application file for complete search history.

(56) References Cited

U.S. PATENT DOCUMENTS

| | | | |
|---|---|---|---|
| 6,457,654 B1* | 10/2002 | Glezer et al. ..................... 239/4 |
| 6,498,316 B1* | 12/2002 | Aher et al. ................ 219/121.44 |
| 6,588,497 B1* | 7/2003 | Glezer et al. .................... 165/84 |
| 6,678,157 B1* | 1/2004 | Bestwick ....................... 361/695 |
| 7,957,140 B2* | 6/2011 | Mongia ......................... 361/695 |
| 8,006,917 B2* | 8/2011 | Arik ........................ F15D 1/00 239/102.2 |
| 8,006,961 B1 | 8/2011 | Rutstein |
| 8,307,885 B2 | 11/2012 | Kim et al. |
| 8,342,819 B2* | 1/2013 | Arik ........................ H01L 23/40 239/102.2 |
| 8,496,049 B2* | 7/2013 | Arik ...................... H01L 23/467 165/80.3 |
| 8,559,175 B2* | 10/2013 | Huisman et al. .............. 361/689 |
| 8,636,032 B2* | 1/2014 | Burns et al. ................... 137/828 |
| 8,695,686 B2* | 4/2014 | Sharma ................ H01L 23/467 165/121 |
| 8,752,775 B2* | 6/2014 | Arik ...................... F04B 43/095 239/102.1 |
| 9,062,689 B2 | 6/2015 | Schaaf |
| 9,216,899 B2* | 12/2015 | Arik ...................... H01L 23/467 |
| 9,303,858 B2* | 4/2016 | Seeley ................. F04B 43/046 |
| 9,484,284 B1* | 11/2016 | Gambin .............. H01L 23/4735 |
| 2002/0190165 A1* | 12/2002 | Glezer et al. ................... 244/207 |
| 2004/0106370 A1* | 6/2004 | Honda et al. .................. 454/187 |
| 2005/0057899 A1 | 3/2005 | Lord |
| 2005/0074662 A1* | 4/2005 | Cho et al. ....................... 429/38 |
| 2006/0239844 A1 | 10/2006 | Nakayama |
| 2006/0281398 A1* | 12/2006 | Yokomizo et al. ........... 454/184 |
| 2007/0004204 A1* | 1/2007 | Fukazawa et al. ........... 438/680 |
| 2007/0095987 A1* | 5/2007 | Glezer et al. ............... 244/200.1 |
| 2008/0305258 A1* | 12/2008 | Tsuji ............................. 427/245 |
| 2009/0242888 A1* | 10/2009 | Hosoya .......................... 257/59 |
| 2010/0012301 A1* | 1/2010 | Aarts ............................ 165/120 |
| 2010/0035198 A1 | 2/2010 | Bertoncello et al. |
| 2011/0097985 A1* | 4/2011 | Stauffer et al. ............... 454/162 |
| 2011/0139893 A1 | 6/2011 | Wetzel et al. |
| 2011/0162823 A1 | 7/2011 | Sharma et al. |
| 2011/0227487 A1* | 9/2011 | Nichol et al. ................. 315/158 |
| 2011/0273906 A1* | 11/2011 | Nichol et al. ................. 362/607 |
| 2011/0277848 A1* | 11/2011 | Burns et al. .................... 137/13 |
| 2012/0103831 A1* | 5/2012 | Schrive et al. ............... 205/701 |
| 2012/0170216 A1 | 7/2012 | Arik et al. |
| 2012/0227733 A1* | 9/2012 | Eyal et al. ........................ 127/1 |
| 2013/0213150 A1* | 8/2013 | Covey et al. ............... 73/863.41 |
| 2015/0050147 A1* | 2/2015 | Baruzzini et al. .............. 416/91 |

FOREIGN PATENT DOCUMENTS

| | | |
|---|---|---|
| CN | 101676658 A | 3/2010 |
| CN | 102102686 A | 6/2011 |
| CN | 102256471 A | 11/2011 |
| CN | 102320474 A | 1/2012 |
| CN | 102450114 A | 5/2012 |
| CN | 102713310 A | 10/2012 |
| EP | 2378848 A2 | 10/2011 |
| JP | S5261370 A | 5/1977 |
| JP | 62-264120 A | 11/1987 |
| JP | 2003023283 A | 1/2003 |
| TW | M444490 U | 1/2013 |
| WO | 2010035198 A1 | 4/2010 |

OTHER PUBLICATIONS

European Search Report issued in connection with corresponding EP Application No. 14158786.5 dated Aug. 7, 2014.

Unofficial English Translation of Chinese Office Action issued in connection with corresponding CN Application No. 201410091488.3 dated Apr. 6, 2017.

Taiwan Office Action issued in connection with corresponding TW Application No. 103107076 dated Apr. 11, 2017.

Machine translation of Office Action issued in connection with related CN Application No. 201410091488.3 dated Sep. 20, 2017.

* cited by examiner

SYNTHETIC JET DRIVEN COOLING DEVICE WITH INCREASED VOLUMETRIC FLOW

CROSS-REFERENCE TO RELATED APPLICATION

The present application is a non-provisional of, and claims priority to, U.S. Provisional Patent Application Ser. No. 61/783,065, filed Mar. 14, 2013, the disclosure of which is incorporated herein by reference.

BACKGROUND OF THE INVENTION

Embodiments of the invention relate generally to synthetic jet devices and, more particularly, to an apparatus for increasing the volumetric flow rate and heat transfer rate of synthetic jet devices.

Synthetic jet actuators are a widely-used technology that generates a synthetic jet of fluid to influence the flow of that fluid over a surface to disperse heat away therefrom. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, a control system is used to create time-harmonic motion of the volume changing mechanism. As the mechanism decreases the chamber volume, fluid is ejected from the chamber through the orifice. As the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a "synthetic jet."

One drawback of typical synthetic jet devices is that they generate very low flow rates, so as to only provide for a corresponding low heat transfer rate. This low heat transfer rate can be problematic for systems and devices that require high rates of heat dissipation. Particularly in electronics packages, the rise in heat dissipation levels associated with increasingly powerful processing system has resulted in the need for improved cooling rates that typical synthetic jet devices may not be able to meet. In the microelectronics industry, for example, advances in technology have brought about an increase in transistor density and faster electronic chips, such that the heat flux that must be dissipated to maintain reasonable chip temperatures has also risen. While increasing the size and/or number of synthetic jet devices to meet these increased cooling requirements is possible, it is recognized that there are often severe volume constraints imposed on any cooling systems implemented to cool such electronic packages.

Accordingly, there is a need for a system for cooling heat-producing devices in an efficient manner. There is a further need for such a system to have minimal space requirements and provide an increase in the cooling flow rate.

BRIEF DESCRIPTION OF THE INVENTION

Embodiments of the invention overcome the aforementioned drawbacks by providing a synthetic jet driven cooling device that provides an increased cooling flow rate. The synthetic jet driven cooling device incorporates a package through which a fluid stream is routed and is subjected to coanda and venturi effects to increase a flow rate of the fluid stream so as to provide increased cooling capability.

In accordance with one aspect of the invention, a synthetic jet driven cooling device includes at least one synthetic jet actuator configured to generate and project a series of fluid vortices through an orifice thereof and a manifold coupled to the at least one synthetic jet actuator so as to receive the series of fluid vortices from the orifice of the at least synthetic jet actuator, the series of fluid vortices from the at least one synthetic jet actuator generating a primary air stream. The synthetic jet driven cooling device also includes an air amplifier connected to the manifold by way of a connecting pipe so as to receive the primary air stream, with the air amplifier further comprising an air intake positioned at a first end of the air amplifier and having a first diameter, with the air intake being oriented perpendicular to an outlet of the connecting pipe, an air outlet positioned at a second end of the air amplifier opposite from the first end, and a venturi section positioned between the air intake and the air outlet and having a second diameter that is less than the first diameter. A low pressure region in a center of the venturi section entrains a surrounding air in through the air intake to generate a secondary air stream, the secondary air stream combining with the primary air stream to provide a combined air flow that flows through the venturi and exits the air outlet.

In accordance with another aspect of the invention, a hybrid coanda-venturi cooling device includes at least one synthetic jet actuator configured to generate and project a series of fluid vortices out from an orifice thereof, a manifold coupled to the at least one synthetic jet actuator so as to receive the series of fluid vortices therefrom and generate a primary air stream, and an air amplifier connected to the manifold so as to receive the primary air stream, the air amplifier comprising a venturi section having a reduced cross-sectional area as compared to an air intake of the air amplifier. A coanda effect acting on the primary air stream as it enters the air amplifier and a venturi effect caused by the venturi section of the air amplifier causes a fluid surrounding the air intake to be entrained into the air intake to generate a secondary air stream, the secondary air stream combining with the primary air stream to provide a combined air flow that exits an air outlet of the air amplifier.

In accordance with yet another aspect of the invention, a method of manufacturing a synthetic jet cooling device includes providing one or more synthetic jet actuators each configured to generate and project a series of fluid vortices out from an orifice thereof, coupling a manifold to the one or more synthetic jet actuators so as to receive the series of fluid vortices from the orifices of the synthetic jet actuators and generate a primary air stream therefrom, and connecting an air amplifier to the manifold by way of a connecting pipe so as to receive the primary air stream from the manifold, with the air amplifier comprising a venturi section having a reduced cross-sectional area as compared to an air intake of the air amplifier. Connection of the air amplifier to the synthetic jet stack generates an air flow output from the air amplifier having a higher velocity and volumetric flow rate than the primary air stream generated from the one or more synthetic jet actuators.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENTS

Figure 1:
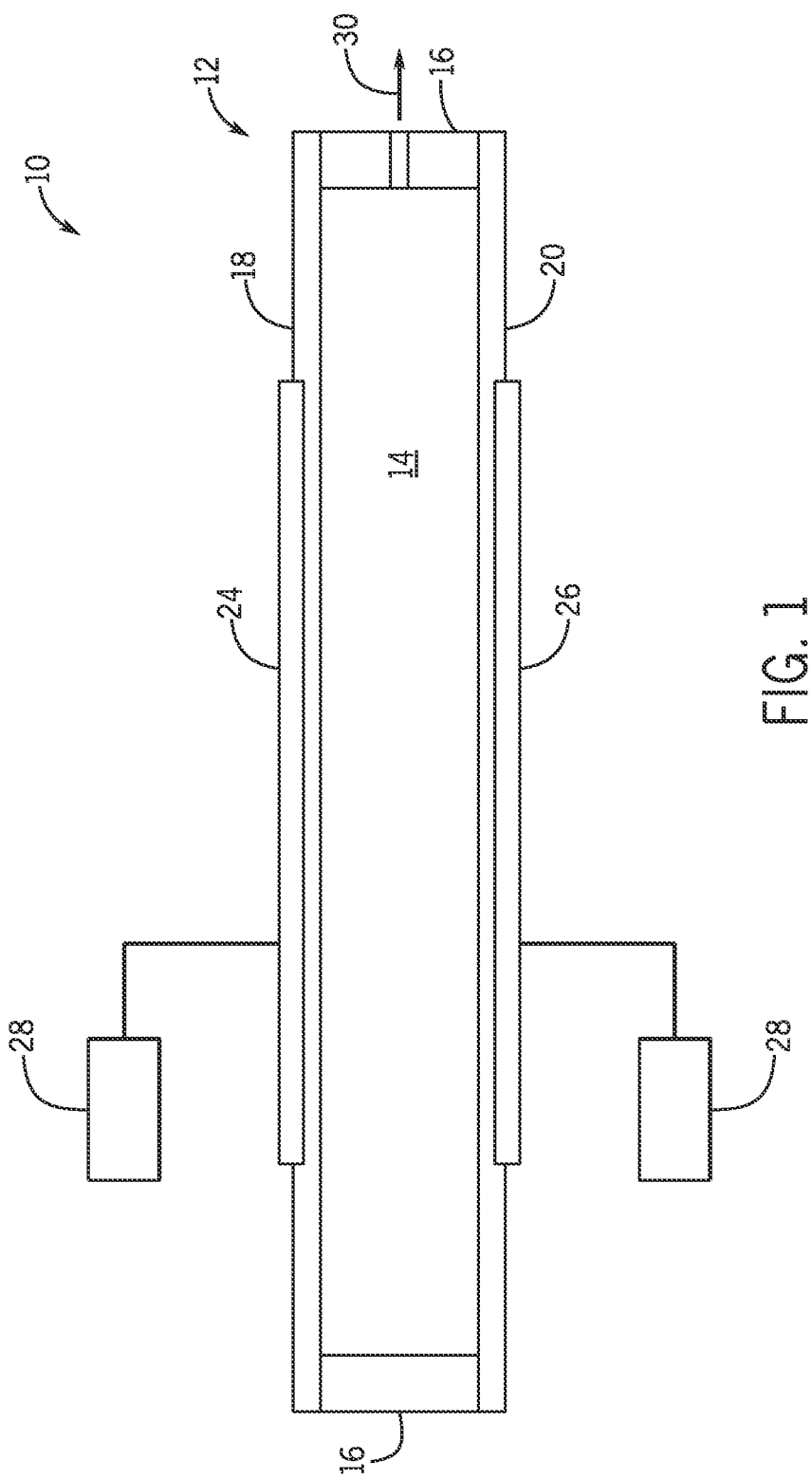
FIG. 1 is a cross-section of a synthetic jet actuator with a control system.
Figure 2:
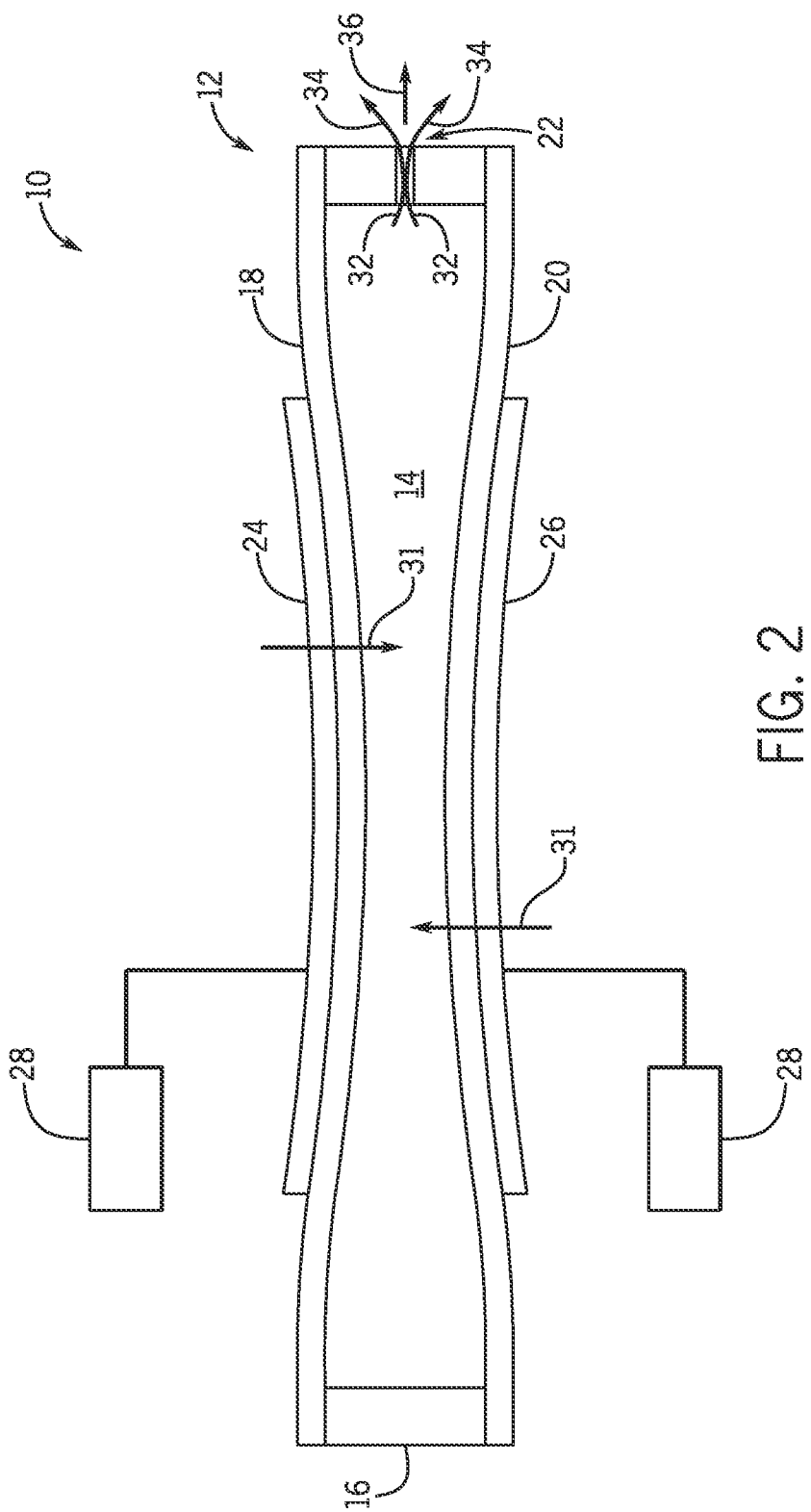
FIG. 2 is a cross-section of the synthetic jet actuator of FIG. 1 depicting the jet as the control system causes the plates to travel inward, toward the orifice.
Figure 3:
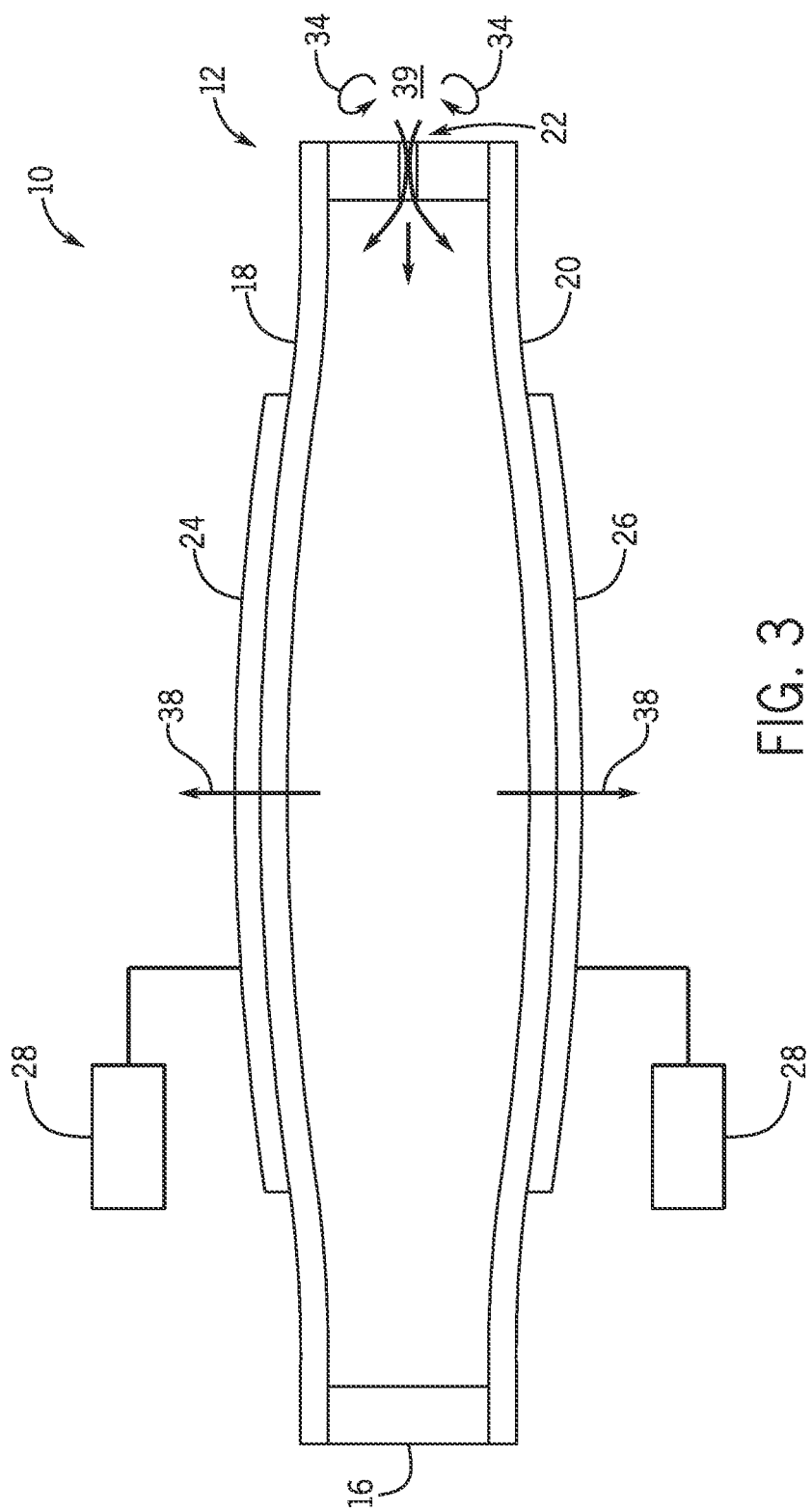
FIG. 3 is a cross-section of the synthetic jet actuator of FIG. 1 depicting the jet as the control system causes the plates to travel outward, away from the orifice.

Referring to FIGS. 1-3, a synthetic jet actuator or device 10, and the operation thereof, that may be used with embodiments of the invention is shown for purposes of describing the general operation of a synthetic jet actuator. The synthetic jet actuator 10 includes a housing 12 defining and enclosing an internal chamber 14. The housing 12 and chamber 14 can take virtually any geometric configuration, such as a disc, an oval, a square, a rectangle, an ellipse, and the like, depending on the application, but for purposes of discussion and understanding, the housing 12 is shown in cross-section in FIG. 1 to have a continuous outer bounding surface or wall 16 and a pair of plates 18, 20 (i.e., top and bottom plates) arranged parallel to one another on either side of the wall 16 so as to define the chamber 14, with one or both of the plates being flexible to an extent to permit displacement thereof inwardly and outwardly relative to the chamber 14. The wall 16 has one or more orifices 22 of any geometric shape that place the internal chamber 14 in fluid communication with a surrounding external environment having ambient fluid (e.g., air), with the orifice(s) 22 being positioned in order to direct fluid emitting therefrom at a desired location and at an object (not shown) positioned proximate to or around the synthetic jet actuator 10.

Attached to at least one of the plates 18, 20, or to both of the plates as shown in FIGS. 1-3, are one or more actuator elements, micromechanical devices, or piezomotive devices 24, 26 configured to cause displacement of the plates. In an exemplary embodiment, actuator elements 24, 26 comprise piezoelectric elements (e.g., piezoelectric disks, monomorph or bimorph) that are configured to periodically receive an electric charge from a controller/power source 28, and undergo mechanical stress and/or strain responsive to the charge. The stress/strain of piezoelectric elements 24, 26 causes deflection of plates 18, 20 such that, for example, a time-harmonic motion or vibration of the plates is achieved. It is recognized that the piezoelectric elements 24, 26 coupled to the plates 18, 20, respectively, can be selectively controlled to cause vibration of one or both of the plates so as to control the volume and velocity of a synthetic jet stream 30 expelled from the synthetic jet actuator 10.

In embodiments of the invention, actuators 24, 26 may include devices other than piezoelectric motive devices such as shape-memory alloys, magnetic materials, electrostatic materials, hydraulic materials, and ultrasonic materials. Thus, in such embodiments, controller/power source 28 is configured to activate actuators 24, 26 in corresponding fashion. That is, for an electrostatic material, controller/power source 28 may be configured to provide a rapidly alternating electrostatic voltage to actuators 24, 26 in order to activate and flex plates 18, 20 to which actuators 24, 26 are attached. Such additional materials may themselves be configured in monomorph and bimorph arrangements.

The operation of the synthetic jet actuator 10 is described with reference to FIGS. 2 and 3. FIG. 2 depicts the synthetic jet actuator 10 as the plates 18, 20 are controlled by controller/power source 28 to move inward into the chamber 14, as depicted by arrow 31. The chamber 14 has its volume decreased and fluid is ejected through the orifice 22. As the fluid exits the chamber 14 through the orifice 22, the flow separates at edges of the orifice 22 and creates vortex sheets 32 which roll into vortices 34 and begin to move away from the orifice edges 30 in the direction indicated by arrow 36.

FIG. 3 depicts the synthetic jet actuator 10 as the plates 18, 20 are controlled to move outward with respect to the chamber 14, as depicted by arrow 38. The chamber 14 has its volume increased and ambient fluid 39 rushes into the chamber 14 as depicted by the set of arrows 40. The plates 18, 20 are controlled by the control system 28 so that when the plates 18, 20 move away from the chamber 14, the vortices 34 are already removed from the orifice edges and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 22.

Figure 4:
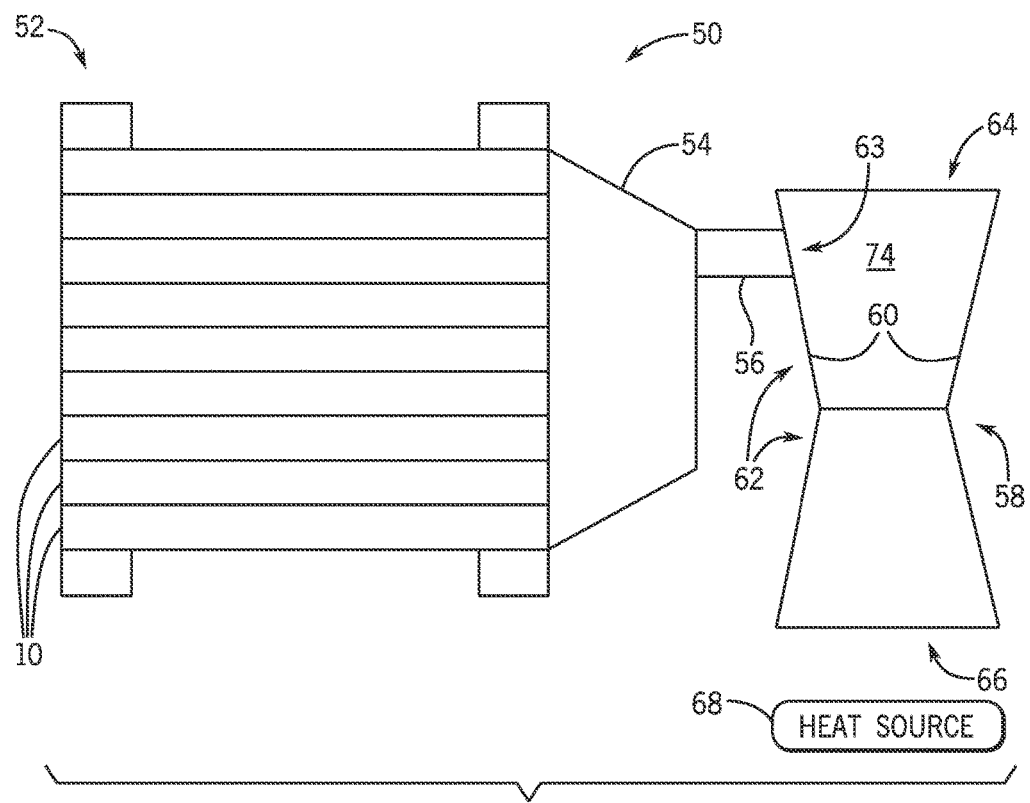
FIGS. 4 and 5 are block schematic diagrams of a synthetic jet driven cooling device according to an embodiment of the invention.
Figure 5:
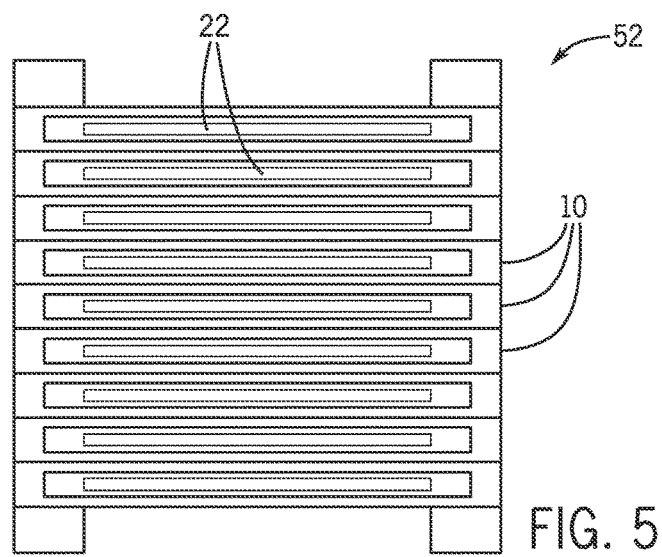

Referring now to FIGS. 4 and 5, a hybrid coanda-venturi synthetic jet driven cooling device 50 is shown according to an embodiment of the invention. The cooling device 50 includes a plurality of synthetic jet actuators/devices 10 such as are shown in FIGS. 1-3, although it is recognized that the structure of the synthetic jet actuators included in the cooling device can vary from that of the synthetic jet actuator 10 shown in FIGS. 1-3. The synthetic jet actuators 10 are arranged to form a synthetic jet stack 52, with the number of synthetic jet actuators 10 included in the stack 52 being determined based on a necessary flow volume output required to drive the cooling device. As shown in FIG. 5, the orifice 22 of each of the synthetic jet actuators 10 in the stack 52 are aligned such that the jets of fluid emanating from each synthetic jet actuator 10 flows in the same direction.

Referring again to FIG. 4, a manifold 54 is coupled to the stack of synthetic jet actuators 10 and is positioned to cover the plurality of orifices 22 of the synthetic jet actuators 10, such that the jets of fluid emanating from the synthetic jet actuators 10 are gathered by the manifold 54. The jets of fluid gathered by the manifold 54 are directed to an connecting pipe 56 (or similar component) that connects the manifold 54 to an air amplifier 58 of the cooling device 50, with the connecting pipe 56 being positioned relative to the air amplifier 58 such that the jets of fluid from the synthetic jet actuators 10 that are routed through the connecting pipe 56 are caused to exit an outlet 63 of the connecting pipe 56 at a throat 60 of a venturi section 62 of the air amplifier 58.

As shown in FIG. 4, the air amplifier 58 also includes an additional air intake 64 that is separate from the connecting pipe 56, with the air intake 64 being oriented perpendicular to the connecting pipe 56. An air outlet 66 is positioned opposite from air intake 64, on the other side of the venturi section 62, and can be positioned so as to be adjacent to a heat source 68 to be cooled, such that an amplified air flow having increased velocity and volume exiting the air outlet 66 is directed at the heat source 68. According to one embodiment, the heat source 68 could be in the form of a microelectronics circuit package and accordingly, the cooling device 50 could be configured as a micro-venturi device designed to fit within tight volume constraints imposed by the microelectronics circuit package.

Figure 6:
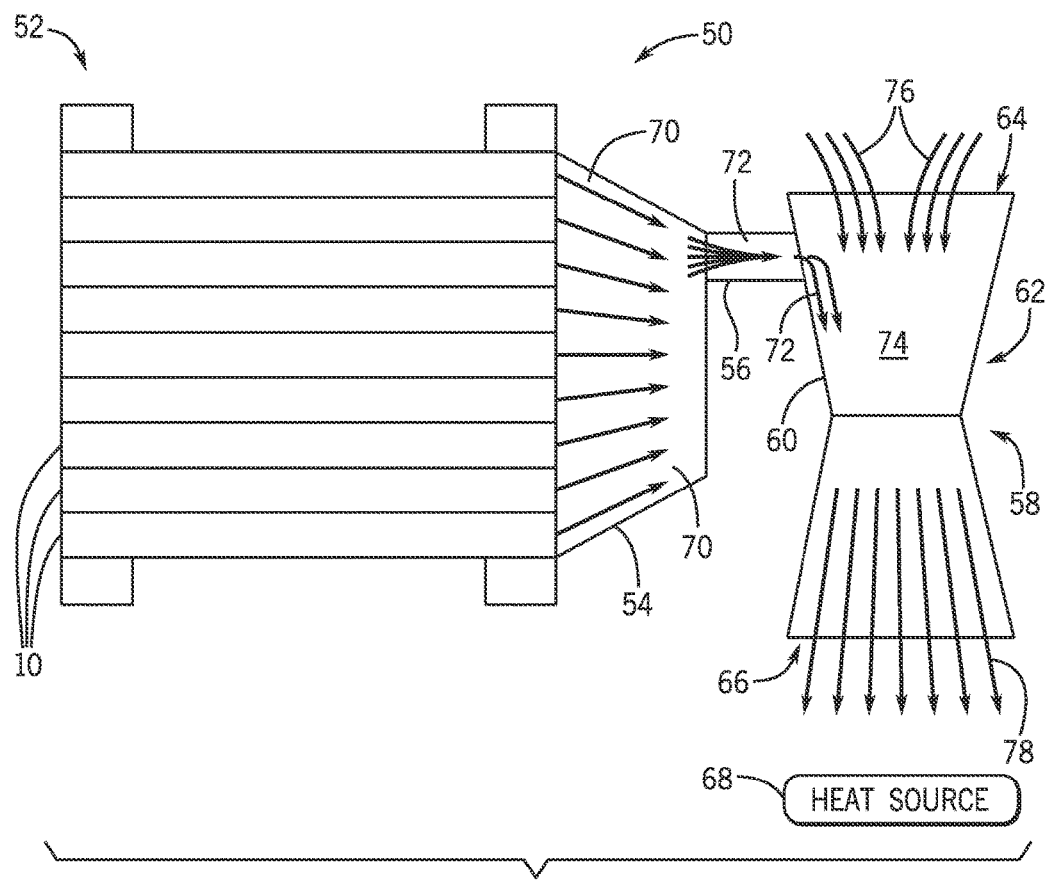
FIG. 6 is a block schematic diagram illustrating fluid flows generated by the synthetic jet driven cooling device of FIGS. 4 and 5.

Operation of the hybrid coanda-venturi synthetic jet driven cooling device 50—and the airflows generated thereby is generally illustrated in FIG. 6. In operation of the cooling device 50, jets of fluid (i.e., air) generated by the synthetic jet actuators 10, indicated as 70, are gathered by the manifold 54 and compressed to flow through the connecting pipe 56. The air is throttled through the connecting pipe 56 at high velocity and exits into the air amplifier 58 at the throat of the venturi section 62 as a primary air stream, indicated as 72. Due to the coanda effect, this primary air stream 72 that exits the connecting pipe 56 follows a path which is close to the surface 74 of the venturi section 62—i.e., the primary air stream 72 adheres to the coanda profile—and is directed through the venturi 62 and toward the air outlet 66 of the air amplifier 58. The adhering of the primary air stream 72 close to the surface of the venturi creates a low pressure region in the center of the venturi, indicated as 74 which entrains the surrounding fluid/air entering the air amplifier through air intake to create a secondary air stream, generally indicated as 76, that flows in the direction of the primary air stream 72—thereby creating a high volume flow of air into the primary air stream 72. The combination of the coanda and venturi effects serves to increase the volumetric flow rate from the synthetic jet device, with the combined flow of the primary air stream 72 and the surrounding air (i.e., secondary air stream 74) exiting the air outlet as a high volume, high velocity combined air flow, indicated as 78.

Figure 7:
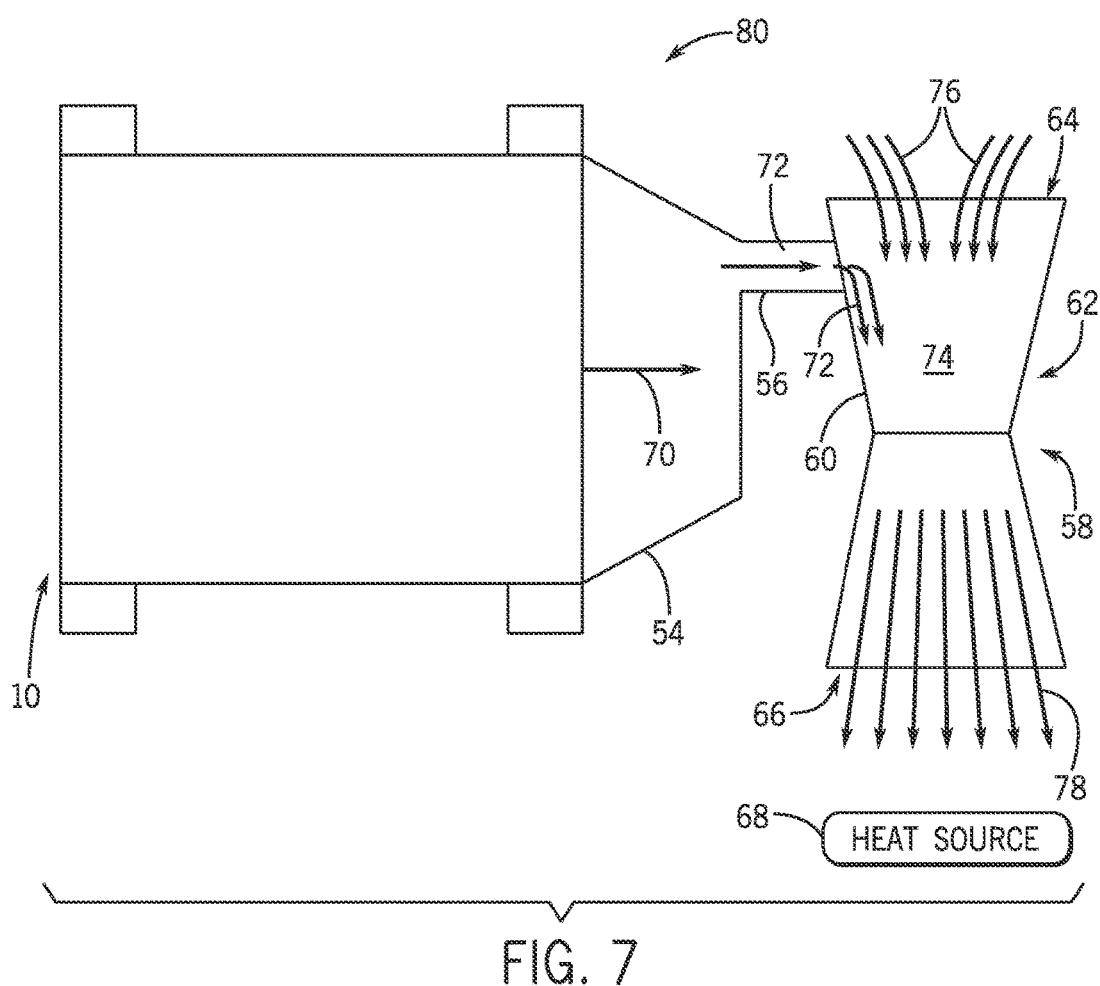
FIG. 7 is a block schematic diagram of a synthetic jet driven cooling device according to an embodiment of the invention.

Referring now to FIG. 7, a synthetic jet cooling device 80 is shown according to another embodiment of the invention. The synthetic jet cooling device 80 is similar in structure and operation to that of the synthetic jet cooling device 50 shown in FIGS. 4 and 6, except that the stacked arrangement 52 of a plurality of individual synthetic jet actuators 10 in synthetic jet cooling device 50 is replaced by a single synthetic jet actuator 10 in synthetic jet cooling device 80. That is, it is recognized that an embodiment of the invention may be directed to a synthetic jet cooling device that incorporates only a single synthetic jet actuator rather than a plurality of synthetic jet actuators. In such an embodiment, the synthetic jet cooling device 80 may still take advantage of the coanda and venturi effects to increase the volumetric flow rate from the synthetic jet cooling device.

Beneficially, embodiments of the invention thus provide a synthetic jet cooling device 50, 80 that is designed to take advantage of the coanda and venturi effects to increase the volumetric flow rate from the synthetic jet cooling device, with a resulting flowrate being as much as 15-20 times (for example) that of a flowrate generated by a similarly sized cooling device that is not designed to make use of the coanda and venturi effects (i.e., that relies just on the fluid jets generated by the synthetic jet actuators). Accordingly, the heat transfer rate that can be achieved by the synthetic jet cooling device 50, 80 is enhanced significantly. As a result, for the same heat transfer rate the size of the synthetic jet cooling device 50, 80 could be reduced—such that the cooling device could be implemented in an application having severe volume constraints imposed on the cooling system, such as might be encountered in cooling microelectronics circuit packages. Alternatively, for the same size of the cooling device 50, 80, the heat transfer rate could be increased dramatically.

Therefore, according to one embodiment of the invention, a synthetic jet driven cooling device includes at least one synthetic jet actuator configured to generate and project a series of fluid vortices through an orifice thereof and a manifold coupled to the at least one synthetic jet actuator so as to receive the series of fluid vortices from the orifice of the at least synthetic jet actuator, the series of fluid vortices from the at least one synthetic jet actuator generating a primary air stream. The synthetic jet driven cooling device also includes an air amplifier connected to the manifold by way of a connecting pipe so as to receive the primary air stream, with the air amplifier further comprising an air intake positioned at a first end of the air amplifier and having a first diameter, with the air intake being oriented perpendicular to an outlet of the connecting pipe, an air outlet positioned at a second end of the air amplifier opposite from the first end, and a venturi section positioned between the air intake and the air outlet and having a second diameter that is less than the first diameter. A low pressure region in a center of the venturi section entrains a surrounding air in through the air intake to generate a secondary air stream, the secondary air stream combining with the primary air stream to provide a combined air flow that flows through the venturi and exits the air outlet.

According to another embodiment of the invention, a hybrid coanda-venturi cooling device includes at least one synthetic jet actuator configured to generate and project a series of fluid vortices out from an orifice thereof, a manifold coupled to the at least one synthetic jet actuator so as to receive the series of fluid vortices therefrom and generate a primary air stream, and an air amplifier connected to the manifold so as to receive the primary air stream, the air amplifier comprising a venturi section having a reduced cross-sectional area as compared to an air intake of the air amplifier. A coanda effect acting on the primary air stream as it enters the air amplifier and a venturi effect caused by the venturi section of the air amplifier causes a fluid surrounding the air intake to be entrained into the air intake to generate a secondary air stream, the secondary air stream combining with the primary air stream to provide a combined air flow that exits an air outlet of the air amplifier.

According to yet another embodiment of the invention, a method of manufacturing a synthetic jet cooling device includes providing one or more synthetic jet actuators each configured to generate and project a series of fluid vortices out from an orifice thereof, coupling a manifold to the one or more synthetic jet actuators so as to receive the series of fluid vortices from the orifices of the synthetic jet actuators and generate a primary air stream therefrom, and connecting an air amplifier to the manifold by way of a connecting pipe so as to receive the primary air stream from the manifold, with the air amplifier comprising a venturi section having a reduced cross-sectional area as compared to an air intake of the air amplifier. Connection of the air amplifier to the synthetic jet stack generates an air flow output from the air amplifier having a higher velocity and volumetric flow rate than the primary air stream generated from the one or more synthetic jet actuators.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A synthetic jet driven cooling device comprising:
   at least one synthetic jet actuator configured to generate and project a series of fluid vortices, each of the at least one synthetic jet actuators comprising an orifice through which the series of fluid vortices are projected;
   a manifold coupled to the at least one synthetic jet actuator so as to receive the series of fluid vortices from the orifice of the at least synthetic jet actuator, the series of fluid vortices from the at least one synthetic jet actuator generating a primary air stream;
   an air amplifier connected to the manifold by way of a connecting pipe so as to receive the primary air stream, the air amplifier comprising:
      an air intake positioned at a first end of the air amplifier and having a first diameter, with the air intake being oriented perpendicular to an outlet of the connecting pipe;
      an air outlet positioned at a second end of the air amplifier opposite from the first end; and
      a venturi section positioned between the air intake and the air outlet and having a second diameter that is less than the first diameter;
   wherein a low pressure region in a center of the venturi section entrains a surrounding air in through the air intake to generate a secondary air stream, the secondary air stream combining with the primary air stream to provide a combined air flow that flows through the venturi and exits the air outlet; and
   wherein each of the at least one synthetic jet actuators comprises:
      a first plate;
      a second plate spaced apart from the first plate and arranged parallelly thereto;
      a wall coupled to and positioned between the first and second plates to form a chamber and including the orifice therein; and
      a piezoelectric actuator element coupled to at least one of the first and second plates to selectively cause deflection thereof, thereby changing a volume within the chamber so that the series of fluid vortices are generated and projected out from the orifice of the wall.

2. The cooling device of claim 1 wherein the outlet of the connecting pipe is coupled to the air amplifier at a throat of the venturi section that tapers the air amplifier down from the first diameter of the air intake to the second diameter of the venturi section.

3. The cooling device of claim 2 wherein, upon exiting the connecting pipe, the primary air stream is caused to flow in proximity to a surface of the venturi section of the air amplifier due to the coanda effect.

4. The cooling device of claim 1 wherein the venturi section of the air amplifier causes a velocity of the primary air stream to increase as it passes therethrough due to the venturi effect, thereby also forming the low pressure region in the center of the venturi section.

5. The cooling device of claim 1 wherein the combined air flow that exits the air outlet of the air amplifier has a higher velocity and volumetric flow rate than the primary air stream generated from the series of fluid vortices from the at least one synthetic jet actuator.

6. The cooling device of claim 5 wherein the volumetric flow rate of the combined air stream is 15 to 20 times greater than that of the primary air stream.

7. The cooling device of claim 1 wherein the air outlet of the air amplifier is positioned adjacent a heat source, such that the combined air flow provides cooling to the heat source.

8. The cooling device of claim 1 wherein the air amplifier comprises a micro-venturi device configured to fit within volume constraints imposed by a microelectronics circuit package that is being cooled.

9. The cooling device of claim 1 wherein the at least one synthetic jet actuator comprises a plurality of synthetic jet actuators arranged in a vertically stacked configuration, with the orifice of each of the plurality of synthetic jet actuators being aligned with other orifices such that the series of fluid vortices projected from each synthetic jet actuator is directed into the manifold.

10. A hybrid coanda-venturi cooling device comprising:
    at least one synthetic jet actuator, each of the at least one synthetic jet actuators configured to generate and project a series of fluid vortices out from an orifice thereof;
    a manifold coupled to the at least one synthetic jet actuator so as to receive the series of fluid vortices therefrom, the series of fluid vortices from the at least one synthetic jet actuator generating a primary air stream;
    an air amplifier connected to the manifold so as to receive the primary air stream, the air amplifier comprising a venturi section having a reduced cross-sectional area as compared to an air intake of the air amplifier;
    wherein a coanda effect acting on the primary air stream as it enters the air amplifier and a venturi effect caused by the venturi section of the air amplifier causes a fluid surrounding the air intake to be entrained into the air intake to generate a secondary air stream, the secondary air stream combining with the primary air stream to provide a combined air flow that exits an air outlet of the air amplifier;
    wherein the at least one synthetic jet actuator comprises a plurality of synthetic jet actuators arranged in a vertically stacked configuration, with the orifice of each of the plurality of synthetic jet actuators being aligned with other orifices such that the series of fluid vortices projected from each synthetic jet actuator is directed into the manifold; and
    wherein each of the at least one synthetic jet actuators comprises:
       a first plate;
       a second plate spaced apart from the first plate and arranged parallelly thereto;

a wall coupled to and positioned between the first and second plates to form a chamber and including the orifice therein; and a piezoelectric actuator element coupled to at least one of the first and second plates to selectively cause deflection thereof, thereby changing a volume within the chamber so that the series of fluid vortices are generated and projected out from the orifice of the wall.

11. The cooling device of claim 10 wherein the primary air stream enters the air amplifier in a direction generally perpendicular to the air intake of the air amplifier and at a throat of the venturi section.

12. The cooling device of claim 11 wherein the throat of the venturi section tapers the air amplifier down from a first diameter at the air intake to a second diameter of the venturi section that is less than the first diameter.

13. The cooling device of claim 10 wherein the coanda effect acting on the primary air stream as it enters the air amplifier causes the primary air stream to flow in proximity to a surface of the venturi section of the air amplifier.

14. The cooling device of claim 10 wherein the venturi section of the air amplifier causes a velocity of the primary air stream to increase as it passes therethrough due to the venturi effect, thereby also forming a low pressure region in a center of the venturi section that causes the fluid surrounding the air intake to be entrained into the air intake.

15. The cooling device of claim 10 wherein the combined air flow that exits the air outlet of the air amplifier has a higher velocity and volumetric flow rate than the primary air stream generated from the series of fluid vortices from the at least one synthetic jet actuator.

16. A method of manufacturing a synthetic jet cooling device comprising:

providing one or more synthetic jet actuators each configured to generate and project a series of fluid vortices out from an orifice thereof;

coupling a manifold to the one or more synthetic jet actuators so as to receive the series of fluid vortices from the orifices of the synthetic jet actuators, the series of fluid vortices from the one or more synthetic jet actuators generating a primary air stream;

connecting an air amplifier to the manifold by way of a connecting pipe so as to receive the primary air stream from the manifold, the air amplifier comprising a venturi section having a reduced cross-sectional area as compared to an air intake of the air amplifier;

wherein connection of the air amplifier to the one or more synthetic jet actuators generates an air flow output from the air amplifier having a higher velocity and volumetric flow rate than the primary air stream generated from the one or more synthetic jet actuators;

wherein a coanda effect acting on the primary air stream as it enters the air amplifier and a venturi effect caused by the venturi section of the air amplifier causes a fluid surrounding the air intake to be entrained into the air intake to generate a secondary air stream, the secondary air stream combining with the primary air stream to provide the air flow output that exits an air outlet of the air amplifier; and wherein connecting the air amplifier to the manifold comprises connecting an outlet of the connecting pipe to the air amplifier at a throat of the venturi section, with the outlet of the connecting pipe being oriented perpendicular to the air intake of the air amplifier, such that the primary air stream is subject to the coanda effect and venturi effect.

17. The cooling system of claim 16 wherein the one or more synthetic jet actuators comprises a plurality of synthetic jet actuators, and wherein the method further comprises arranging the plurality of synthetic jet actuators into a synthetic jet stack and such that the orifices of the plurality of synthetic jet actuators are aligned.

* * * * *